United States Patent
Iwai

(10) Patent No.: US 8,174,171 B2
(45) Date of Patent: May 8, 2012

(54) PIEZOELECTRIC VIBRATING DEVICES HAVING BISYMMETRIC VIBRATING ARMS AND SUPPORTING ARMS, AND DEVICES COMPRISING SAME

(75) Inventor: Hiroki Iwai, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 315 days.

(21) Appl. No.: 12/560,346

(22) Filed: Sep. 15, 2009

(65) Prior Publication Data

US 2010/0079036 A1    Apr. 1, 2010

(30) Foreign Application Priority Data

Sep. 29, 2008    (JP) .................... 2008-251181

(51) Int. Cl.
*H03H 9/25* (2006.01)
*H01L 41/04* (2006.01)
(52) U.S. Cl. ...................................................... 310/370
(58) Field of Classification Search ................. 310/370
See application file for complete search history.

(56) References Cited

U.S. PATENT DOCUMENTS

| | | | | |
|---|---|---|---|---|
| 7,015,631 B2 * | 3/2006 | Hirasawa et al. | ............. | 310/370 |
| 7,061,167 B2 * | 6/2006 | Yamada | .................... | 310/370 |
| 7,342,352 B2 * | 3/2008 | Kawashima | ................. | 310/370 |
| 7,368,861 B2 * | 5/2008 | Tanaya | .......................... | 310/370 |
| 7,521,846 B2 * | 4/2009 | Tanaya | .......................... | 310/370 |
| 7,592,741 B2 * | 9/2009 | Tanaya et al. | ................ | 310/370 |
| 7,675,224 B2 * | 3/2010 | Tanaya | .......................... | 310/370 |
| 2004/0263027 A1 * | 12/2004 | Kawashima | ................. | 310/361 |
| 2005/0017604 A1 * | 1/2005 | Yamada | ........................ | 310/370 |

FOREIGN PATENT DOCUMENTS

| | | | |
|---|---|---|---|
| JP | 58064128 U | * | 4/1983 |
| JP | 2004-282230 | | 10/2004 |
| JP | 2004-357178 | | 12/2004 |
| JP | 2005-039767 | | 2/2005 |
| JP | 2005-102138 | | 4/2005 |
| JP | 2006-148857 | | 6/2006 |
| JP | 2006-352771 | | 12/2006 |
| JP | 2007013910 A | * | 1/2007 |
| JP | 2007-243535 | | 9/2007 |
| JP | 2009165006 A | * | 7/2009 |

* cited by examiner

*Primary Examiner* — Jaydi San Martin
(74) *Attorney, Agent, or Firm* — Klarquist Sparkman, LLP

(57) ABSTRACT

An exemplary tuning-fork type piezoelectric vibrating piece has at least a pair of vibrating arms extending from one end of a base portion in a certain longitudinal direction (e.g., Y-direction). Supporting arms extend from respective side edges of the base, outboard of the vibrating arms in the certain direction. The supporting arms have respective mounting regions near their distal tips. Each supporting arm progressively narrows from its proximal end, coupled to the respective side edge of the base, to its respective mounting region. The progressive narrowing can be via one or more constrictions along the length of the supporting arm.

20 Claims, 9 Drawing Sheets

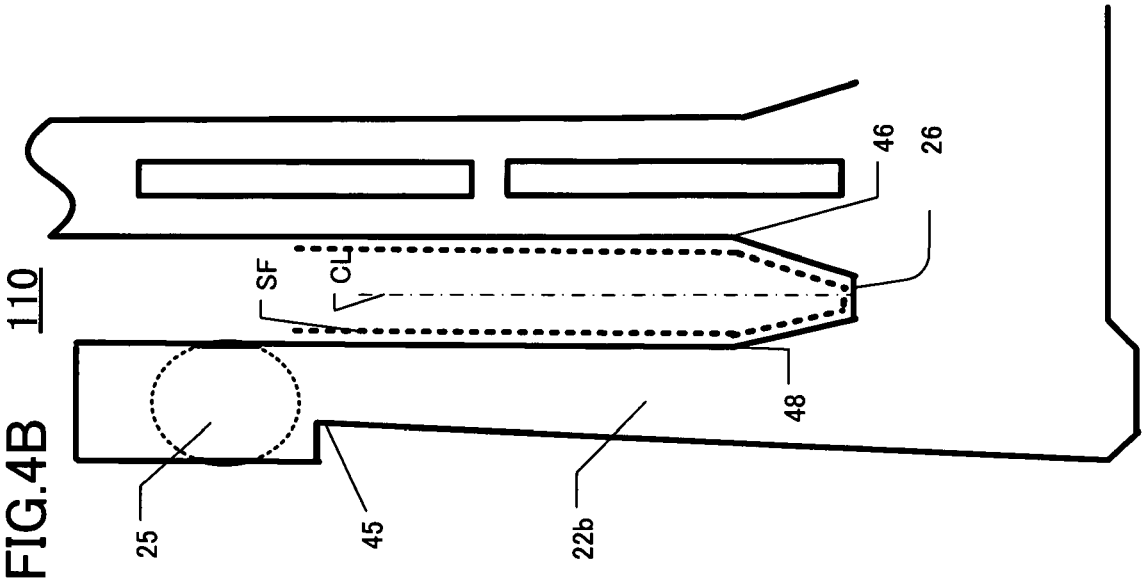
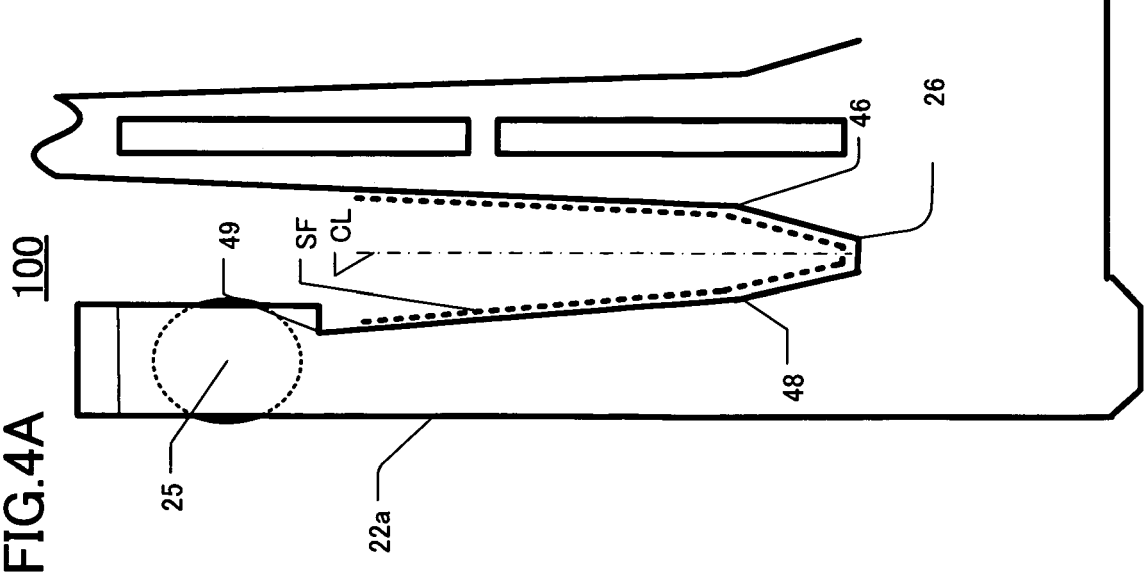

– PRIOR ART –

PIEZOELECTRIC VIBRATING DEVICES HAVING BISYMMETRIC VIBRATING ARMS AND SUPPORTING ARMS, AND DEVICES COMPRISING SAME

CROSS-REFERENCE TO RELATED APPLICATION

This application claims priority to and the benefit of Japan Patent Application No. 2008-251181, filed on Sep. 29, 2008, in the Japan Patent Office, the disclosure of which is incorporated herein by reference in its entirety.

FIELD

This disclosure pertains to, inter alia, methods for manufacturing tuning-fork type piezoelectric vibrating elements comprising supporting arms.

DESCRIPTION OF THE RELATED ART

Various types of clocks, home electric appliances, consumer electronics, and various types of commercial/industrial electrical apparatus such as information/communication devices and Office-Automation devices utilize at least one oscillator. These oscillators typically are manufactured by packaging a piezoelectric resonator, a piezoelectric vibrating piece, or an IC chip as a clock source for addition to and use by an electronic circuit of the apparatus. In other apparatus, piezoelectric timing devices such as real-time clock modules are widely used.

Especially nowadays, such piezoelectric vibrating devices must be increasingly miniaturized and/or provided with a thinner or lower profile to be accommodated in electronic devices and packaging schemes that are correspondingly miniaturized and/or provided with a lower profile. Also, modern piezoelectric devices must be able to provide a low CI (crystal impedance) value as well as have high quality and stability. To minimize the CI value, tuning-fork type piezoelectric vibrating pieces have been developed. To miniaturize such pieces further, they have been configured with shorter base lengths and supporting arms.

In Japan Unexamined Patent Application No. JP2005-102138, as shown in FIG. 8, a pair of vibrating arms 16 extends from a base 12. A bottom portion 11 also extends from the base 12. Attached to the bottom portion 11 is a pair of supporting arms 14 that extend outboard of and parallel to the vibrating arms 16. The supporting arms 14 terminate in mounting portions 15 that also extend parallel to the vibrating arms 16. By configuring and mounting the supporting arms 14, vibrating arms 16, and mounting portions 15 in this longitudinal manner, adverse influences of changes in external temperature and/or physical impacts from dropping the package are reduced. The supporting arms 14 also reduce oscillation leakage from the vibrating arms 16 (oscillating inside the package) to the exterior of the package, thereby improving the CI value.

Reducing the length (vertical dimension in FIG. 8) of the base 12 to accommodate the demands of miniaturization, especially using the conventional approach of adding a pair of supporting arms 14, does not fully prevent oscillation leakage from the piezoelectric vibrating piece 10. Not sufficiently preventing oscillation leakage allows the CI value to increase disadvantageously. Anomalous etch zones also deform the tuning-fork type piezoelectric vibrating piece 10 during fabrication. Even small variations in the dimensions of the vibrating arms 21 and/or root portions thereof caused by anomalous etching produce significant vibration leakage. Especially with increased miniaturization, etchant may not flow sufficiently around the root portions of the vibrating arms 21, during manufacture thereof, to produce desired etching rates and/or etching results in these locations. Also, etching may be more difficult to perform with more miniaturized configurations of piezoelectric vibrating pieces due to anisotropy of the crystal material from which they are made.

In view of the above, one object of the invention is to provide tuning-fork type piezoelectric vibrating pieces having shorter bases and supporting arms to reduce vibration leakage to the exterior, while still allowing a desired state of miniaturization of the vibrating pieces to be achieved. The tuning-fork type piezoelectric vibrating pieces remain bisymmetric after concluding etching by being sufficiently concerned with anisotropy caused by etching.

SUMMARY

Various aspects of the invention include piezoelectric vibrating pieces and piezoelectric devices comprising same. According to a first aspect, piezoelectric vibrating pieces are provided, of which an embodiment comprises a base having a first end edge, an opposing second end edge, and side edges extending from the first end edge to the second end edge. A pair of vibrating arms extends from the first end edge of the base in a designated longitudinal direction (e.g., Y-direction). A respective supporting arm extends from each side edge of the base, outboard of the vibrating arms, in the designated longitudinal direction. Each supporting arm has a distal-end region and at least one mounting region in the distal-end region. A vibrating-root portion is situated between the vibrating arms, and respective supporting-root portions are situated at the first end edge of the base between each vibrating arm and respective supporting arm. Each supporting arm has a longitudinal edge extending from the respective supporting root portion to the mounting region, and each vibrating arm has a longitudinal edge extending opposite the longitudinal edge of the respective supporting arm. The longitudinal edges extend in a symmetrical manner relative to a respective centerline extending in the designated longitudinal direction between the respective vibrating arm and supporting arm. As a result of this symmetry about the centerlines the supporting arms and vibrating arms have balanced configurations that prevent increases in CI and reduce vibration leakage.

The piezoelectric vibrating piece desirably includes a vibrating root portion situated at the first end edge of the base between the vibrating arms. In this configuration, the distance (e.g., in the Y-direction or longitudinal direction) from the second end edge of the base to the vibrating root portion is substantially equal to the distance in the designated longitudinal direction from the second end edge of the base to each of the supporting root portions. When such a configuration is being fabricated, the flow of wet-etchant between and around the vibrating arms and supporting arms is substantially uniform so that balanced (substantially equal rates of) etching can be achieved in these areas. Achievement of these benefits may be enhanced by configuring the supporting-root portions and the vibrating-root portion with substantially similar plan profiles.

In certain embodiments each vibrating arm progressively narrows in the designated longitudinal direction (e.g., Y-direction) from its root portion to a constriction (as defined herein). From the constriction to its distal end, the vibrating arm has a width greater than of the constriction.

In other embodiments each vibrating arm progressively narrows in the designated longitudinal direction (e.g., Y-direction) from the root portion to a first width, narrows further from the first width to a second width, and then progressively widens in the designated longitudinal direction from the second width to the distal end.

Another embodiment of a piezoelectric vibrating piece comprises a base, a pair of vibrating arms, and a pair of supporting arms. The vibrating arms extend from the first end edge of the base in a designated longitudinal direction (e.g., Y-direction). A respective supporting arm extends from each side edge of the base, outboard of the vibrating arms, in the designated longitudinal direction. Each supporting arm has a proximal portion at the respective side edge of the base, a distal-end region, and at least one mounting region in the distal end. Each supporting arm progressively narrows in the designated longitudinal direction from the proximal portion to the respective mounting region. These embodiments inhibit reduced vibration leakage from the vibrating arms through the base and through a base plate of a package. For example, vibrations are not readily conducted from the vibrating arms to the mounting regions and beyond.

Each supporting arm includes first and second longitudinal side edges (extending in or substantially in the designated longitudinal direction (e.g., Y-direction)). In some embodiments each supporting arm progressively narrows in the designated longitudinal direction by one of the first and second longitudinal side edges being tilted relative to the designated longitudinal direction.

In another embodiment respective root portions are situated between each vibrating arm and its respective supporting arm. One of the longitudinal side edges of each vibrating arm and one of the longitudinal side edges of each respective supporting arm are symmetrical with respect to a respective centerline extending in the designated longitudinal direction through the root portion between the respective vibrating arm and respective supporting arm. With such a configuration, during fabrication the flow of wet-etchant is substantially uniform, which produces controlled etching and formation of the vibrating arms and supporting arms.

With the vibrating-root portion being situated between the vibrating arms at the first end edge of the base, the distance (in the designated longitudinal direction, e.g., the Y-direction) from the second end edge of the base to the respective supporting-root portion desirably is substantially equal to the distance in the designated longitudinal direction from the second end edge to the vibrating root portion. Especially if the shapes of the vibrating-root portion and supporting-root portions are similar (similar plan profiles), the flow of etchant is substantially uniform during fabrication, which produces more balanced vibrating arms and supporting arms.

In yet other embodiments, each vibrating arm progressively narrows in the designated longitudinal direction from the root portion to a first width and further narrows from the first width to a second width. From the second width to the distal end, each vibrating arm has a width greater than the second width. Such a configuration of the vibrating arms enhances their oscillation and achieves a stable oscillation frequency.

In another embodiment, each vibrating arm progressively narrows in the designated longitudinal direction from the root portion to a constriction. Then, each vibrating arm progressively widens in the designated longitudinal direction from the constriction to the distal end. Such a configuration of the vibrating arms enhances their oscillation and achieves a stable oscillation frequency.

According to another aspect of the invention, piezoelectric devices are provided. A "piezoelectric device" herein is generally a piezoelectric vibrating piece mounted to and encased in a package. An embodiment comprises any of the piezoelectric vibrating pieces summarized above, for example. The device also includes a package base to which the piezoelectric vibrating piece is mounted via the mounting regions of the supporting arms. The device also includes a lid that covers the piezoelectric vibrating piece and seals the piezoelectric vibrating piece in the package.

The various aspects of this invention provide piezoelectric vibrating pieces and piezoelectric devices that exhibit stable oscillation and stable oscillation frequency, even after miniaturization. Even after miniaturization, the piezoelectric vibrating pieces are resistant to CI degradation.

BRIEF DESCRIPTION OF THE DRAWINGS

FIG. 4A is a plan view of a portion of the embodiment of a tuning-fork type crystal vibrating piece shown in FIG. 1A.

FIG. 4B is a plan view of a portion of the embodiment of a tuning fork type crystal vibrating piece shown in FIG. 3.

DETAILED DESCRIPTION

An exemplary tuning-fork type crystal vibrating piece of this invention is configured to oscillate at a frequency of 32.768 kHz. The length of this piece in the Y-direction is about 1.45 mm, width in the X-direction is about 0.5 mm, and height in the Z-direction is about 0.1 mm. (See orientation of axes in FIG. 1A, for example.) Dimensional variations can arise during the etching step used for forming the profile outline of the tuning-fork type crystal vibrating piece. These small dimensional variations from specifications can have substantial impact (e.g., undesired increases in CI) in view of the small size of the miniaturized tuning-fork type crystal vibrating piece. The following embodiments provide tuning-fork type crystal vibrating pieces that can be miniaturized while exhibiting desired CI values, despite having dimensional variations.

Figure 1A:
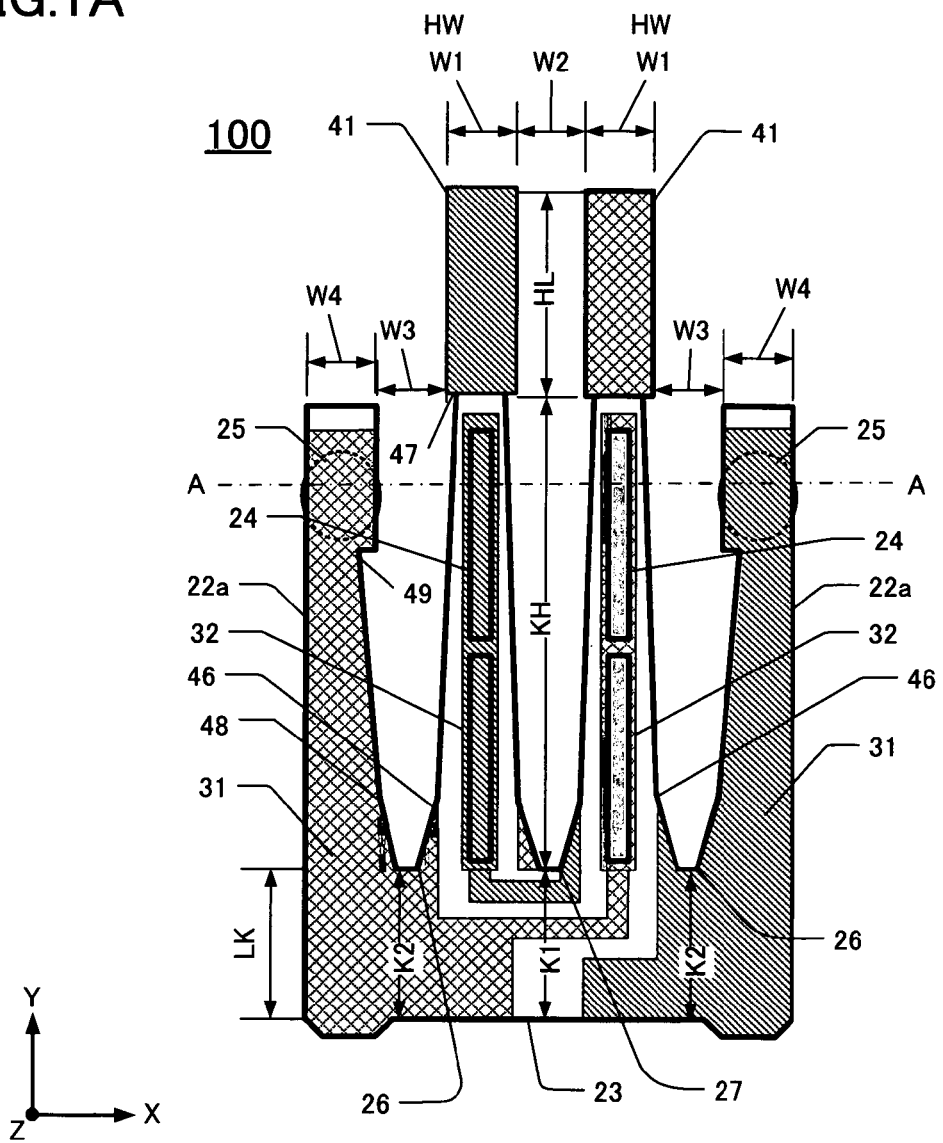
FIG. 1A is a plan view of a first embodiment of a tuning-fork type crystal vibrating piece.
Figure 1B:
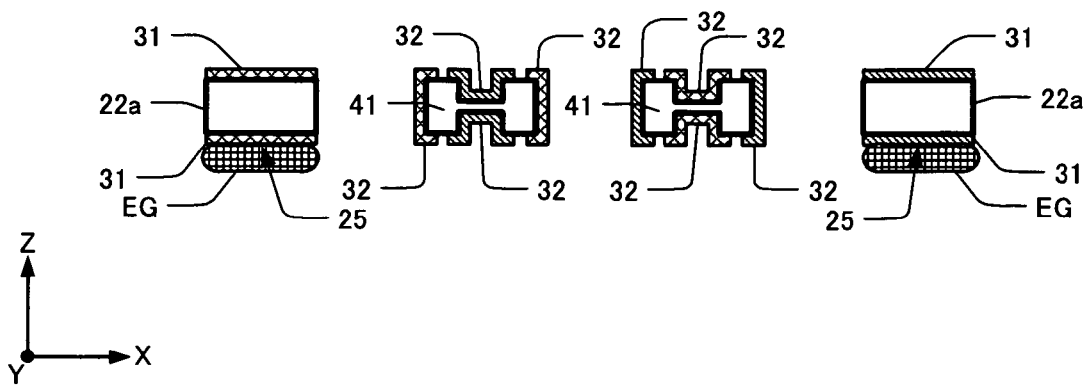
FIG. 1B is a cross-sectional view along the line A-A in FIG. 1A.

A first embodiment of a tuning-fork type crystal vibrating piece 100 is shown in FIG. 1A. The crystal vibrating piece 100 comprises a first pair of vibrating arms 41 and a pair of supporting arms 22a. FIG. 1B is a cross-sectional view along the line A-A in FIG. 1A. The vibrating arms 41 extend from a base 23. The length LK of the base 23 (in the Y-direction) is about 0.15 mm, and the length (in the Y-direction) of each vibrating arm 41 is about 1.3 mm.

The vibrating arms 41 extend parallel to each other from the base 23 in the Y-direction. A respective groove 24 is formed on each of the upper and lower surfaces of each vibrating arm 41, yielding a total of four grooves 24 per pair of vibrating arms 41. As shown in FIG. 1B, a cross-section of a vibrating arm 41 having grooves 24 on the upper and lower surfaces has a substantially H-shaped transverse profile. The H-shaped profile is effective in reducing the CI of the crystal vibrating piece 100. Although this embodiment has a total of four grooves 24 formed on the pair of vibrating arms 41, it will be understood that more than one groove can be formed on each side of each vibrating arm. Other embodiments, such as the second, third and forth embodiments described later below, have grooves 24 similar to those in the embodiment of FIG. 1A.

Each vibrating arm 41 has "root" portions 26, 27 at which the vibrating arm is connected to the base 23. The root portions 26, 27 are wider (in the X-direction) than the width of the arm itself. Each root portion 26, 27 concentrates stress, generated by vibration of the respective arm 41, and transfers the stress to a first constriction (or first "width") 46 to reduce vibration leakage to the base 23. A "constriction" such as item 46 is an abrupt, rather than gradual, change in the rate of change of width in the designated longitudinal direction. The vibrating arms 41 gradually become narrower with increased distance from their root portions and thus define the respective first constrictions 46. The vibrating arms 41 gradually become narrower with increased distance from the first constriction 46 and thus define respective second constrictions (second "widths") 47 near the distal tips of the vibrating arms. The vibrating arms 41 become substantially wider at the second constriction 47 to form the lateral edges of respective hammer-heads 33 situated on the distal ends of the vibrating arms. During vibration of the arms 41, the hammer-heads do not touch each other.

The narrowness of the vibrating arms 41, as well as their first and second constrictions 46, 47 shifts stresses, that otherwise would concentrate around the root portions of the arms, to the edges of the vibrating arms. Such shifting of stresses reduces vibration leakage to the base 23. Also, by specifying the width HW and length HL of the hammer-heads 33, as well as the distance KH from the base to the proximal edge of the hammer-head 33, increases of the CI value can be controllably reduced. Also prevented by such measures are secondary-harmonic oscillations of the arms 41, which allows the arms to vibrate at their stable fundamental harmonic.

Also extending from opposing lateral ends of the base 23 of this embodiment are respective supporting arms 22a. The supporting arms 22a extend outboard of and substantially parallel to the vibrating arms 41. Each supporting arm 22a has a wide root portion 26, discussed later below. The supporting arms 22a progressively narrow (in the X-direction) with increased distance from their root portions 26 and form a third constriction (third "width") 48. From the third constriction 48 the supporting arms 22a further progressively narrow and form a fourth constriction (fourth "width") 49 near the distal ends of the supporting arms. At the fourth constriction 49 the supporting arms 22a suddenly widen to form respective hammer-heads 34. The hammer-heads 34 include mounting regions 25 for connecting the supporting arms 22a to a package PKG, discussed later below. The progressively narrow profile of the supporting arms 22a, particularly the progressive narrowing from the third constriction 48, absorbs oscillation leakage.

The base 23 of the crystal vibrating piece 100 has a substantially "board" characteristic. The length LK (Y-direction) of the base 23 is desirably is as short as practicable to minimize the overall length (Y-direction) of the crystal vibrating piece 100. However, only reducing the length LK of the base may cause conduction of vibrations from the vibrating arms 41 to the exterior of the package as vibration leakage. Only reducing the length LK may also cause vibrations of the arms 41 to be adversely affected easily by temperature changes or by physical impacts outside the package. Therefore, in this embodiment, the supporting arms 22a are specifically configured to reduce vibration leakages and thereby reduce sensitivity of the vibrating arms 41 to external changes. The supporting arms 22a are mounted via the mounting regions 25 to a package enclosing the crystal vibrating piece 100. The mounting regions 25 are located appropriately distally from the base 23 to reduce vibration leakages from the vibrating arms 41 and hence reduce internal effects of external changes. Making the profile outline of the crystal vibrating piece 100 with the configuration described below reduces unwanted configurational anomalies caused by etching and allows tuning-fork type crystal vibrating pieces 100 to be produced having symmetry and balance.

As FIG. 1A shows, the base 23 extends the length LK in the Y-direction. The supporting arms 22a extend in the Y-direction from respective locations on the base 23 that are extended slightly in the X-direction. The width dimension between the vibrating arms 41 (specifically, between the hammer-heads 33) is denoted W2. Note that W2 is substantially equal to the width W1 of each vibrating arm 41 (specifically, the width of each hammer-head 33). Note also that W1 is substantially equal to the width dimension W3 between each vibrating arm 41 and its respective supporting arm 22a (specifically, between the hammer-heads 33, 34). Similarly, the width dimension W4 of each hammer-head 34 is substantially equal to W3. Thus, the "first" width W1, the "second" width W2, the "third" width W3, and "fourth" width W4 of the crystal vibrating piece 100 are all substantially equal to each other in this embodiment.

As a result of W1=W2=W3=W4, the flow of etchant around the arms 41, 22a during fabrication is substantially uniform, which forms a precisely bisymmetric crystal vibrating piece 100.

The "vibrating root" portion 27 connects inboard proximal portions of the vibrating arms 41 to the base 23. Hence, the vibrating root portions 27 are situated between the vibrating arms 41. The region between the vibrating root portions 27 is U-shaped with angular sides and bottom. Similarly, the respective "supporting root" portions 26 connect outboard proximal portions of the vibrating arms 41 and inboard proximal portions of the supporting arms 22a to the base 23. The region between the supporting root portions 26 is U-shaped with angular sides and bottom. The base 23 has a length LK in the Y-direction sufficient for providing the length K1 from the bottom of the vibrating root portion 27 and the lengths K2 from the bottom of each supporting root portion 26. All three root zones have the same coordinate in the Y-direction (but different coordinates in the X-direction). Hence, K1=K2.

Despite differences in etch rates of the crystal material of the crystal vibrating piece caused by crystal anisotropy, the desired shape of the crystal vibrating piece 10 can be achieved by forming the above-described shapes of the vibrating-arm root portions 27 and supporting-arm root portions 26, and also by making K1=K2. That is, the crystal vibrating piece 100 can be made bisymmetric as desired by making the widths W1=W2=W3=W4, and K1=K2, and each root portion substantially the same shape.

The supporting arms 22a desirably are shorter in length (Y-direction) than the vibrating arms 41. After forming the profile outline of the crystal vibrating piece 100, electrodes are formed on the upper and lower surfaces of the vibrating arms 41, and metal layers are formed on the distal upper surfaces of the vibrating arms, all at the same time. The metal layers on the distal upper surfaces of the vibrating arms 41 act as weights to enhance arm vibration and make the vibrating arms stable. Also, the Q value is increased with stable vibration. The distal ends of the vibrating arms 41 can include additional metal coatings for use as "weights". The weights allow attainment of just the right vibration frequency; the weights can be trimmed (e.g., using a laser) after manufacture to achieve a desired frequency tuning control of the tuning-fork type crystal vibrating piece 100 when used as a piezoelectric device. The general outline profiles and grooves 24 of the crystal vibrating piece 100 are formed using known photolithography and etching techniques. Specific details of forming the outline profile and grooves 24 are discussed below.

Forming the Profile Outline

The profile outlines of multiple tuning-fork type crystal vibrating pieces 100 are typically formed simultaneously on a circular or rectangular shaped crystal wafer. First, the profile outlines are defined by forming on the surface of the wafer a patterned mask made of a corrosion-resistant film. The mask defines openings that are vulnerable to etching. Etching is conducted using, for example, fluorinated acid solution which etches the crystal exposed in the openings of the mask. The corrosion-resistant film of the mask is a metal film deposited on a chrome sub-film. Etching desirably is by wet-etching. Etching conditions can be varied depending on density of the wafer, concentration of fluorinated acid, and etching temperature.

Forming the Grooves

After forming the outline profiles of the crystal vibrating pieces 100, the grooves 24 are formed using a resist that is microlithographically patterned for forming the grooves on the vibrating arms 41. The resist is applied to form respective walls that sandwich each desired groove region. The corrosion-resistant film of the mask is left in areas where the grooves 24 are not formed. Then, wet-etching is performed on both the upper and lower surfaces of the vibrating arms 41, with etching conditions being substantially the same as during wet-etching performed to form the outline profiles. The depth of the grooves 24 is normally 30 to 45 percent of the thickness of the vibrating arms.

Note that either or both the wet-etching steps discussed above (for forming profile outlines and for forming grooves) can alternatively be performed by dry-etching instead of wet-etching. For dry-etching, metal masks are formed on a crystal wafer to define the profile outline of the crystal vibrating piece 100. Then, another respective metal mask is formed on the crystal wafer surface to define the grooves. In such a condition, the crystal wafer is placed into a chamber (not shown), and etching gas is delivered to the chamber that has been evacuated to a pre-designated degree of vacuum to form an etching plasma. The etching plasma is a dry-etchant.

For example, a source of Freon (®Dupont) gas and a source of oxygen gas can be connected to a chamber that is also connected to a vacuum source by an evacuation conduit. Via the conduit, the vacuum source establishes a predetermined vacuum state in the chamber. Meanwhile, Freon gas and oxygen gas are delivered to the chamber to establish desired concentrations of these gases in the subatmospheric environment in the chamber. At the desired concentrations of gases and vacuum level, a direct-current voltage is discharged in the chamber to produce a plasma. The plasma ionizes the molecules of the gases, and the ions bombard the regions of the piezoelectric vibrating piece not covered by the metal mask. This bombardment ablates the piezoelectric material, resulting in dry-etching.

Forming the Electrodes

In FIG. 1A, electrodes on the arms 41, 22a comprise base electrodes 31 and excitation electrodes 32. The excitation electrodes 32 are formed on the upper and lower surfaces of the vibrating arms 41, as shown in FIG. 1B. The mounting regions 25 on the supporting arms 22a are for mounting the crystal vibrating piece 100 on respective pads of electrically conductive adhesive EG inside the package. The base electrodes 31 and the excitation electrodes 32 each have a two-layer structure in which a layer of Au is formed on a sub-layer of Ni, for example.

To form an electrode, metal layers intended to constitute the electrode are formed on the entire surfaces of the arms by vacuum deposition or sputtering. The electrodes are patterned by photolithography using a resist to define denuded areas where electrodes are not to be formed. Then, electrodes (as well as the weights on the distal ends of the vibrating arms) are formed on the front and rear surfaces of the vibrating arms 41 by sputtering or vacuum deposition. As noted, the weights are used for fine adjustment of the vibration frequency of the vibrating arms 41.

The following embodiment omits illustrations and discussion of electrodes because the electrodes are formed in the same way as described above.

Fabrication of a Piezoelectric Device

Figure 2A:
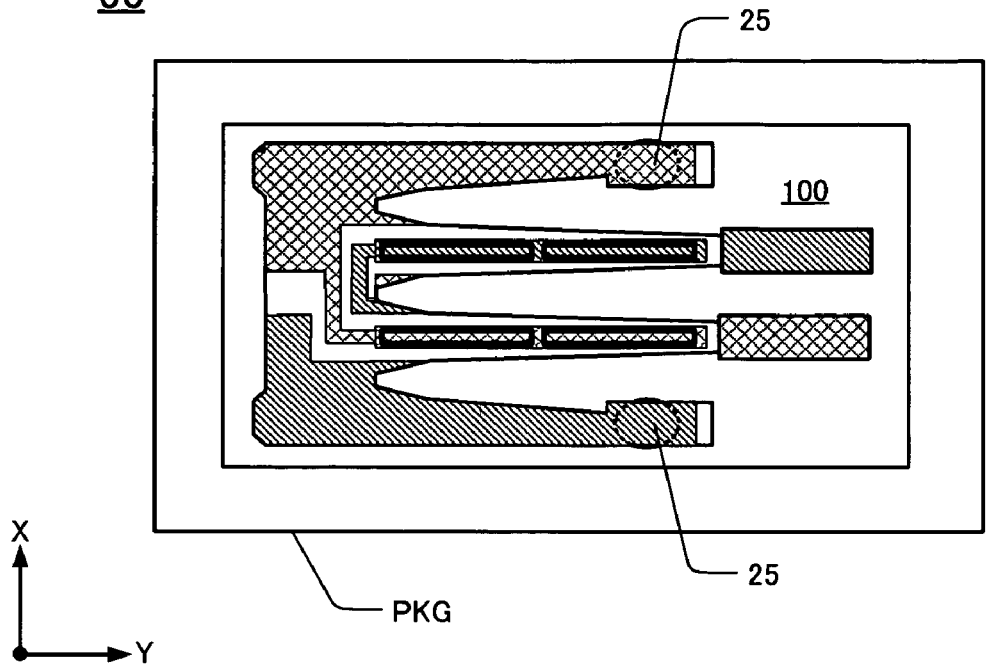
FIG. 2A is a plan view of an embodiment of a piezoelectric device.
Figure 2B:
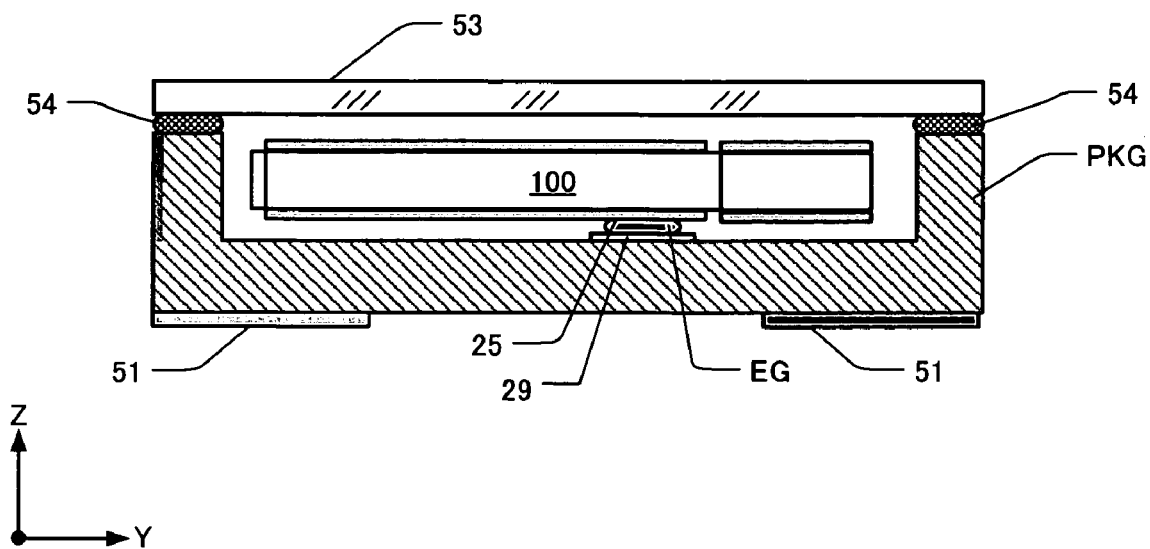
FIG. 2B is a schematic cross-sectional view of the piezoelectric device 50 shown in FIG. 2A.

A "piezoelectric device" is generally a crystal vibrating piece including and contained in a package. FIG. 2A is a schematic plan (top) view of a piezoelectric device 50 of this embodiment. FIG. 2B is a cross-sectional view of FIG. 2A, showing the package PKG with the piezoelectric vibrating piece 100 located inside. The piezoelectric device 50 is formed as follows. A tuning-fork type crystal vibrating piece 100, formed as described above, is placed into a package PKG that defines a cavity. The package PKG is then placed in a vacuum chamber in which a lid 53 is placed on the package PKG over the cavity (containing the crystal vibrating piece 100) and sealed to the package PKG using a sealing material 54. By forming the lid 53 of borosilicate glass, for example, or other suitable translucent material, the vibration frequency of the piezoelectric device 50 can be fine-tuned after sealing the package, using a trimming laser illuminated through the lid.

The package PKG desirably is made of ceramic, and can be formed by laminating together a plurality of ceramic sheets to form an open box. The package PKG can be configured as an SMD (surface mount device) by placing external electrodes 51 on the under-surface of the package PKG.

The tuning-fork type crystal vibrating piece 100 is mounted in the package via the mounting regions 25 of the supporting arms 22a. For example, the mounting regions 25 can be mounted on respective units of electrically conductive adhesive applied to respective electrodes (not shown) in the package PKG. After mounting the crystal vibrating piece 100, the electrically conductive adhesive is thermally cured in a curing furnace. The resulting full cure connects the connecting portion 25 in a conductive manner to the tuning-fork crystal vibrating piece 100 and to a mounting-region electrode 29 inside the package PKG. These connections include electrical connections to the external electrode 51 located outside the package PKG.

Adjustment of the vibration frequency of the piezoelectric device 50 is performed by a mass-reduction method. A laser light is irradiated onto the distal surfaces of the vibrating arms 41 on which "weight" metal layers have been formed. The laser light evaporates or sublimates a part of the metal weight material as required to achieve the desired vibration frequency. The manufacture of the piezoelectric device 50 is complete upon performing a test of operational performance of the device.

A piezoelectric device 50 fabricated as described above exhibits less degradation of CI than conventional devices. This greater stability of CI is achieved by, inter alia, modifying the shape of the vibrating arms 41 and the supporting arms 22a of the tuning-fork type crystal vibrating piece 100. The second and third embodiments described below have alternative configurations of the vibrating arms that also exhibit less CI degradation, reduced oscillation leakage, and increased ability to absorb physical impacts from dropping the package.

Second Embodiment

Figure 3:
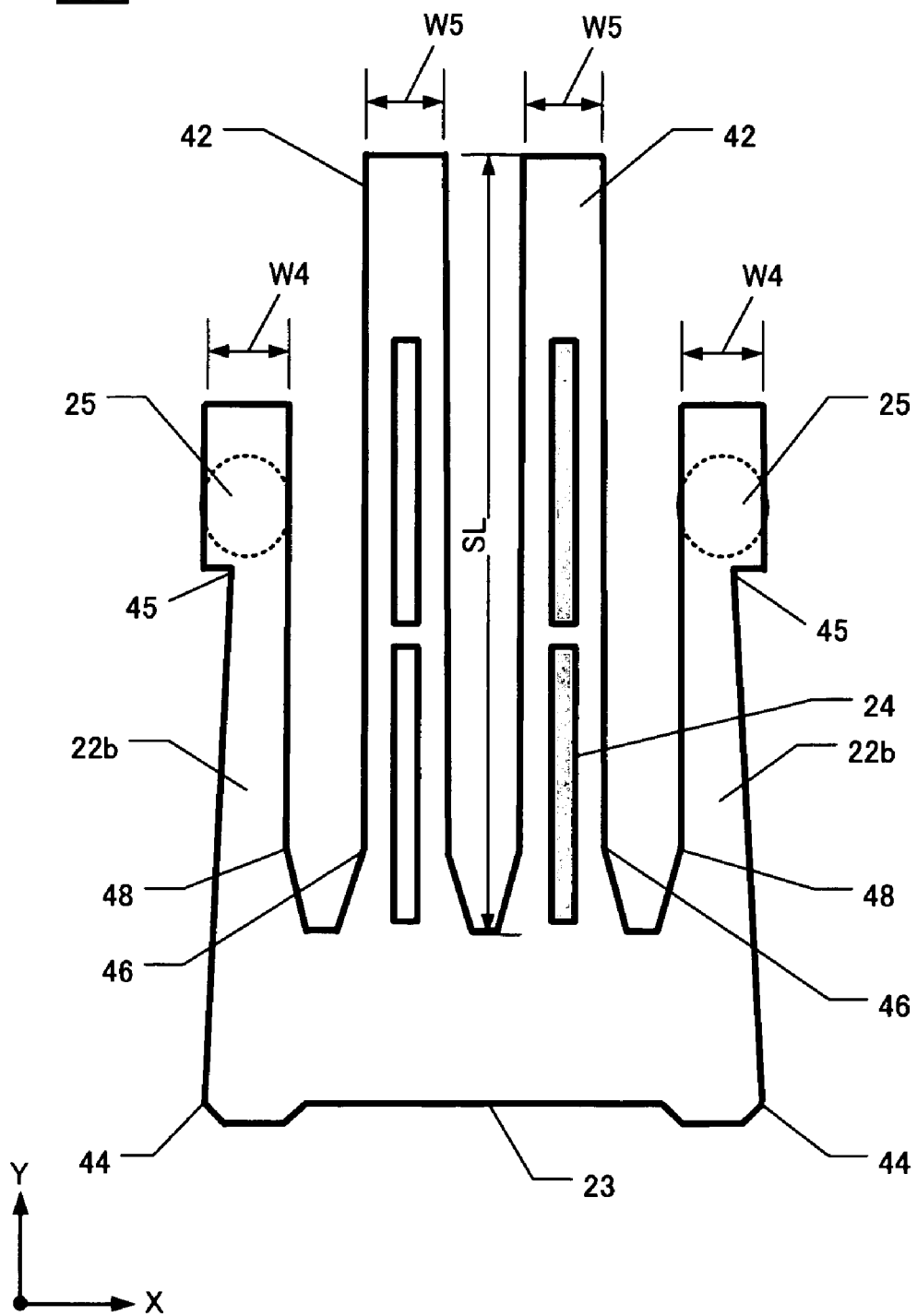
FIG. 3 is a plan view of a second embodiment of a tuning-fork type crystal vibrating piece.

FIG. 3 is a plan view of a second embodiment of the tuning-fork type crystal vibrating piece 110, comprising a pair of vibrating arms 42 and a pair of supporting arms 22b. Except for the configuration of the vibrating arms 42 and supporting arms 22b of this embodiment 110, other components thereof are similar to corresponding components in the first embodiment and are not described further. Also, the electrodes are not shown in FIG. 3 (or described below) to facilitate clarity.

In FIG. 3 the root portions of the vibrating arms 42 extending upward (Y-direction) from the base 23 are wider in the X-direction than in FIG. 1A. The vibrating arms 42 extend "upward" in the Y-direction from the base 23 with an initial configuration in which they progressively narrow with increasing distance in the Y-direction from their respective root portions. A first constriction (or first "width") 46 is located just distally of the root portions. From the first constriction 46 the vibrating arms 42 extend with substantially parallel longitudinal edges to their respective distal termini. The vibrating arms 42 comprise grooves 24 having a length of 55 to 60% of the Y-direction "length" SL of the vibrating arms 42. These grooves 24 serve to reduce the CI value of the device. The root portions of the supporting arms 22b progressively narrow with increasing distance from the base 23 to third constrictions (third "widths") 48. From the third constrictions 48, the inner longitudinal edges of the supporting arms 22b facing respective longitudinal edges of the vibrating arms 42 extend parallel in the Y-direction to the inner longitudinal edges of the second vibrating arms 42.

The outer longitudinal edge of each supporting arm 22b is slightly tilted from the vertical in FIG. 3, from the respective corner location 44 of the base 23 to a constriction ("width") 45. At the constriction 45 and continuing further distally, each supporting arm 22b is substantially wider compared to other portions of the supporting arm. Thus, the supporting arms 22b include respective distal hammer-heads 35. Thus, in this embodiment 110 of a tuning-fork type crystal vibrating piece, the vibrating arms 42 extend in the Y-direction largely with a substantially constant width distally of the constriction 46. Meanwhile, the inboard longitudinal edge of each supporting arms 22b also extends in the Y-direction, substantially parallel to the vibrating arms 42. Only the outboard longitudinal edges of the supporting arms 22b gradually narrow with increasing distance from the constriction 48. During operation, oscillations of the vibrating arms 42 are transferred to the base 23 and then to the supporting arms 22b, which absorb the oscillations.

In the same way as the first embodiment, in this embodiment the tuning-fork type crystal vibrating piece 110 is placed into and sealed in a package PKG to form a piezoelectric device 50. The oscillation frequency of the crystal vibrating piece inside the package PKG can be adjusted, using a trimming laser for example, after sealing the package with the crystal vibrating piece inside.

FIG. 4A is an enlargement of a region in the vicinity of the left-hand root portion 26 of the supporting arm 22a of the first embodiment of a tuning-fork type crystal vibrating piece 100; FIG. 4B is an enlargement of a region in the vicinity of the left-hand root portion 26 of the supporting arm 22b of the second embodiment of a tuning-fork type crystal vibrating piece 110. In FIG. 4A, the inboard longitudinal edge of the supporting arm 22a and the outboard longitudinal edge of the respective vibrating arm 41 are bilaterally symmetrical about a centerline CL which extends upward (Y-direction) in the figure from the root portion 26. This symmetrical region is denoted by the dashed line SF, and extends nearly to the mounting region 25. In FIG. 4B, the inboard longitudinal edge of the supporting arm 22b and the outboard longitudinal edge of the respective vibrating arm 42 are also bilaterally symmetrical about a centerline CL which extends upward (Y-direction) in the figure from the root portion 26. In FIG. 4B, in contrast to FIG. 4A, these longitudinal edges are parallel to each other and to the centerline CL. The symmetrical region in FIG. 4B is also denoted by the dashed line SF, which extends substantially to the mounting region 25.

Thus, in the vicinity of the supporting arms 22a, 22b from the root portion 26 to the mounting region 25, the inboard longitudinal edge of each supporting arm 22a, 22b and the outboard longitudinal edge of each respective vibrating arm 41, 42 are symmetrical to each other about a centerline CL extending in the Y-direction. This symmetry is present whether these longitudinal edges are parallel to each other or whether the width of the supporting arms progressively narrows with increasing distance in the Y-direction from the root portion 26.

Crystal materials generally exhibit anisotropy during wet-etching. Anisotropy occurs in the crystalline X, Y, and Z axes. An exemplary etching rate in the X-Y plane of the crystal vibrating piece is as follows. In the +X direction, wet-etching progresses rapidly in the plane oriented 120° with respect to the X-axis and in the plane oriented −120° with respect to the X-axis. In −X direction, wet-etching progresses slowly in the plane oriented 30° with respect to the X-axis and in the inner surface oriented −30° with respect to the X-axis.

On either embodiment 100, 110 of a tuning-fork type crystal vibrating piece described above, fin-shaped anomalous etch zones (not shown) are frequently formed as a result of crystal anisotropy along the edges of the vibrating arms and supporting arms. However, because the edge surface in the region SF of the vibrating arms facing the supporting arms is symmetrical, flow of etchant in this region during fabrication is uniform and balanced on all the edges, allowing the crystal vibrating pieces 100, 110 to be formed accurately to specification.

Referring again to FIG. 4A, with increasing distance from the base along the edge of the supporting arm 22a opposite the edge of the vibrating arm 41, the supporting arm gradually narrows. In FIG. 4B, with increasing distance from the base along the edge of the supporting arm 22b opposite the edge of the vibrating arm 42, the supporting arm also gradually narrows. Hence, the supporting arms 22a, 22b become narrower with increasing distance (Y-direction) from the supporting root portion 26 to the mounting region 25. Supporting arms having such configurations effectively prevent leakage of vibration from the respective vibrating arms to the respective mounting regions 25.

Other embodiments, such as the third and forth embodiments described later below, also have symmetrical features similar to those in the embodiments of FIGS. 4A and 4B.

Third Embodiment

Figure 5:
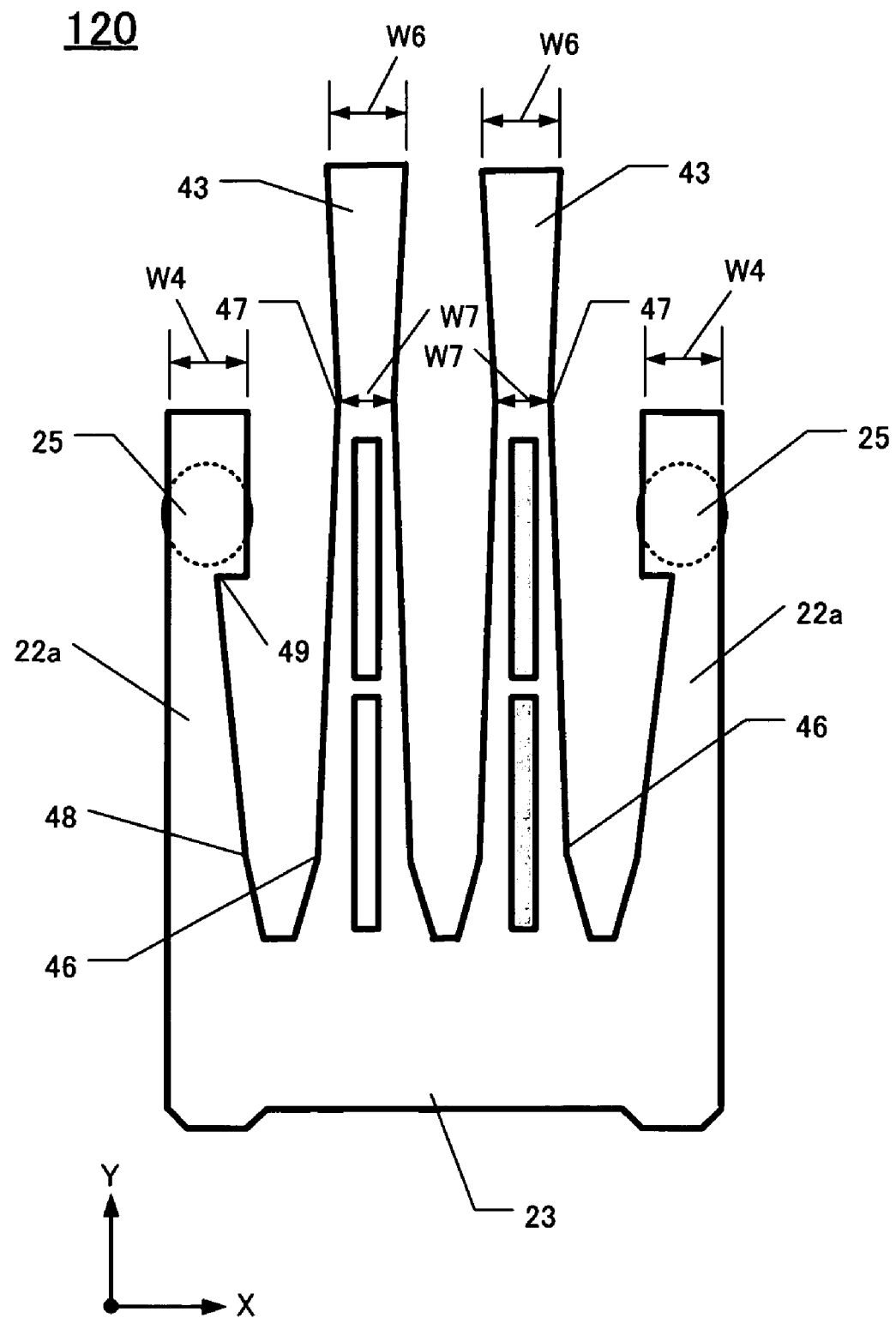
FIG. 5 is a plan view of a third embodiment of a tuning-fork type crystal vibrating piece.

FIG. 5 is a plan view of a tuning-fork type crystal vibrating piece 120 according to a third embodiment. The vibrating arms 43 of this embodiment exhibit improved CI stability. Except for the description of the vibrating arms 43 of this embodiment, descriptions of other components and features of the crystal vibrating piece 120 are not provided because the other components and features are as described above in the first embodiment. Also, the electrodes are not described or shown to facilitate clarity of features actually shown.

Similar to the first embodiment, in the embodiment of FIG. 5 each vibrating arm 43 extends in the Y-direction (upward in the figure) from the base 23 while progressively narrowing to the first constriction (first "width") 46. From the first constriction 46 each vibrating arm 43 progressively narrows further, with increasing distance along the Y-direction, to the second constriction (second "width") 47 located near the distal end of the vibrating arm. From the second constriction 47 each vibrating arm 43 progressively widens, with increasing distance along the Y-direction, to the distal end of the arm. Despite these gradations in width (X-direction) of the vibrating arms 43, the vibrating arms do not touch each other.

In this embodiment, with vibrating arms 43 having the first and second constrictions 46, 47, the vibrating arms 43 are narrower than in certain other embodiments. With such a configuration of the vibrating arms 43, stresses that otherwise would concentrate around the root portions are shifted to the lateral edges of the vibrating arms 43, which reduces vibration leakage to the base 23. Note that the width W6 of each vibrating arm 43 is reduced gradually in both length directions (+Y and −Y directions) toward the minimum width W7 of the second constriction 47. This configuration stabilizes the CI value, prevents generation of higher overtone vibration modes, and produces stable fundamental-frequency vibrations of the vibrating arms.

In the same way as the first embodiment, a crystal vibrating piece 120 according to this embodiment can be sealed into a package PKG to produce a piezoelectric device 50. Also, adjustment of the vibration frequency of the vibrating arms 43 can be performed, by laser trimming, after sealing the crystal vibrating piece in the package.

Fourth Embodiment

Figure 6:
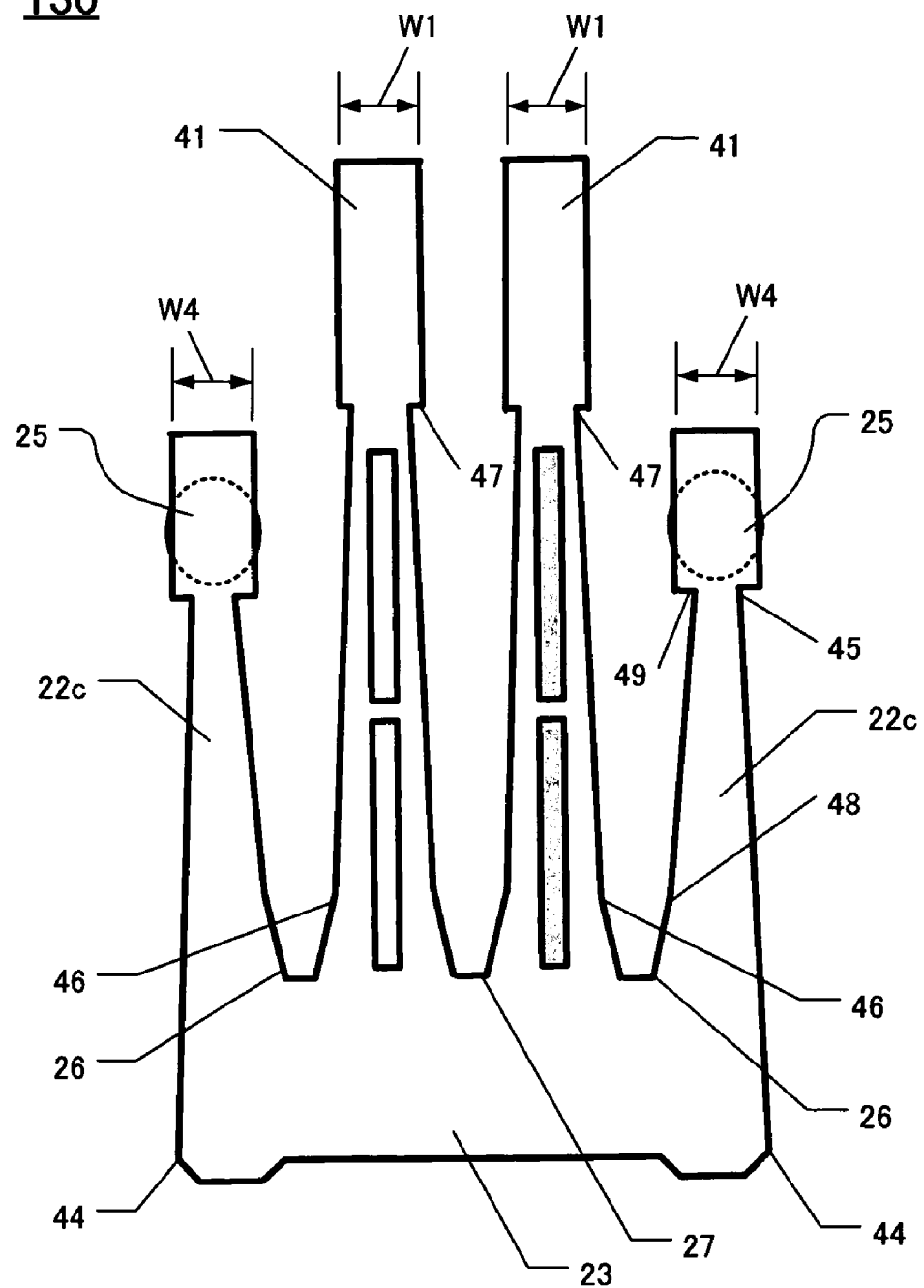
FIG. 6 is a plan view of a fourth embodiment of a tuning-fork type crystal vibrating piece.
Figure 7A:
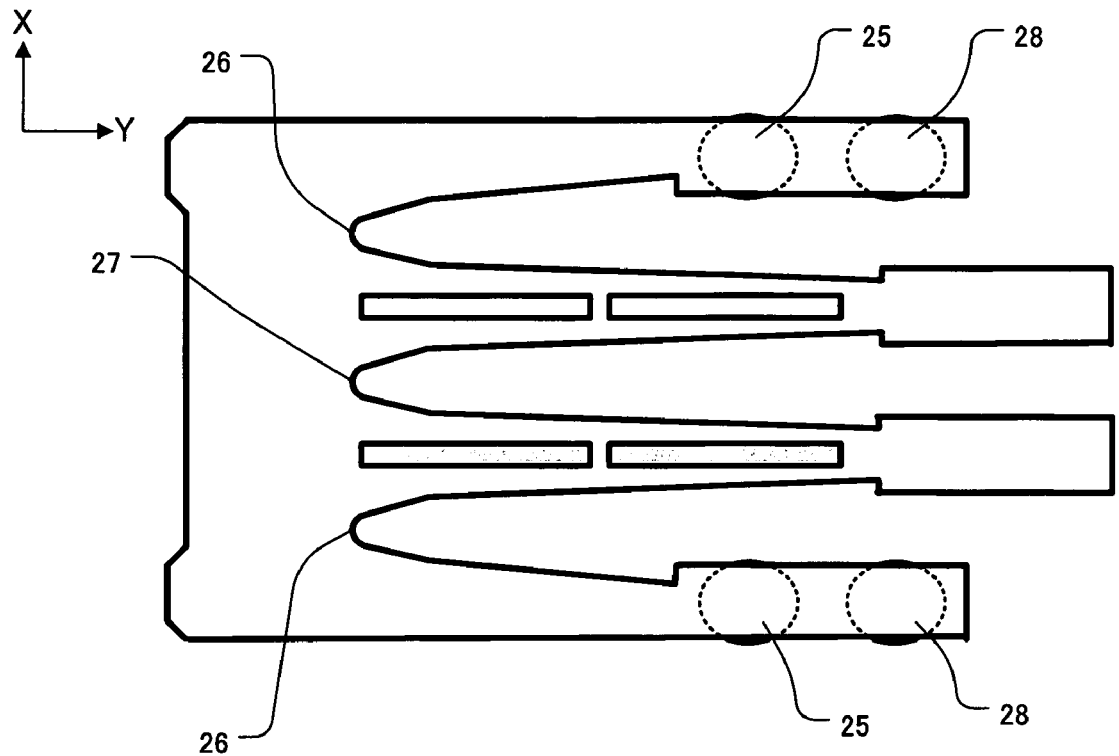
FIG. 7A is a plan view of an alternative configuration of the first embodiment.
Figure 7B:
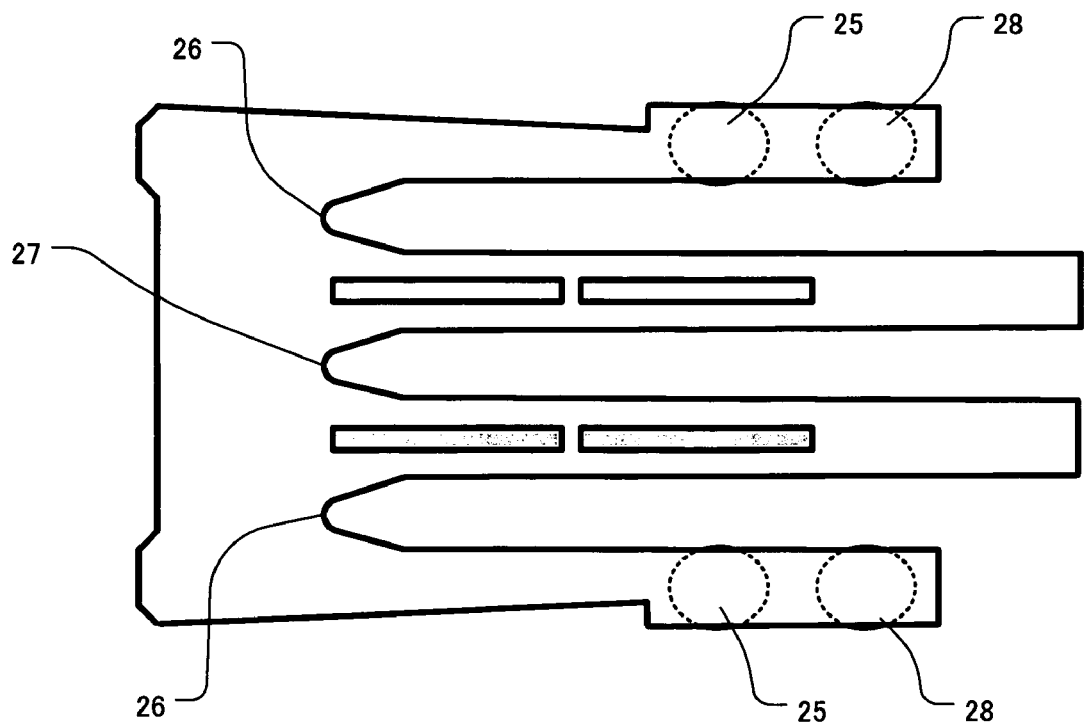
FIG. 7B is a plan view of an alternative configuration of the second embodiment.
Figure 7C:
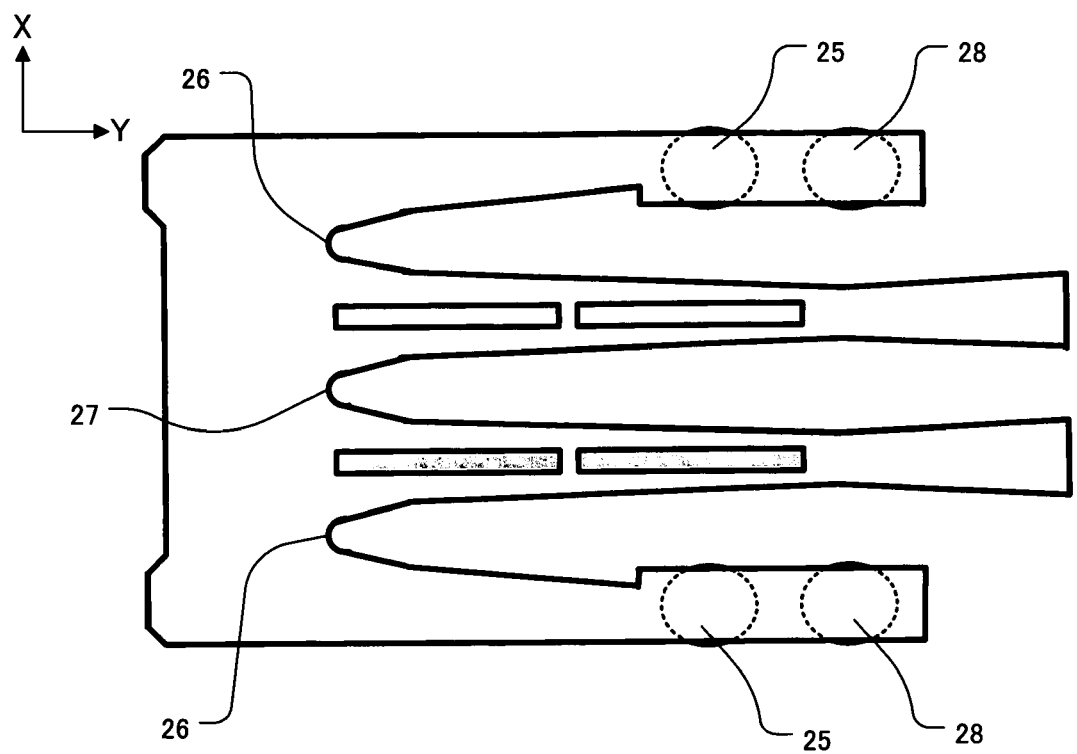
FIG. 7C is a plan view of an alternative configuration of the third embodiment.
Figure 7D:
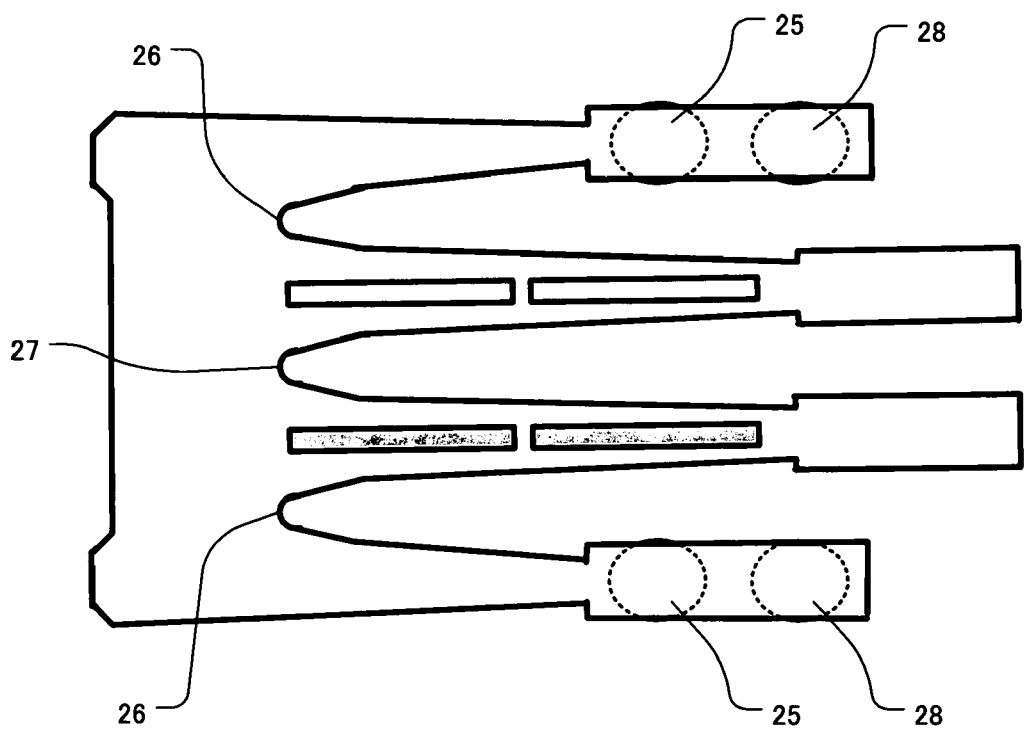
FIG. 7D is a plan view of an alternative configuration of the fourth embodiment.
Figure 8:
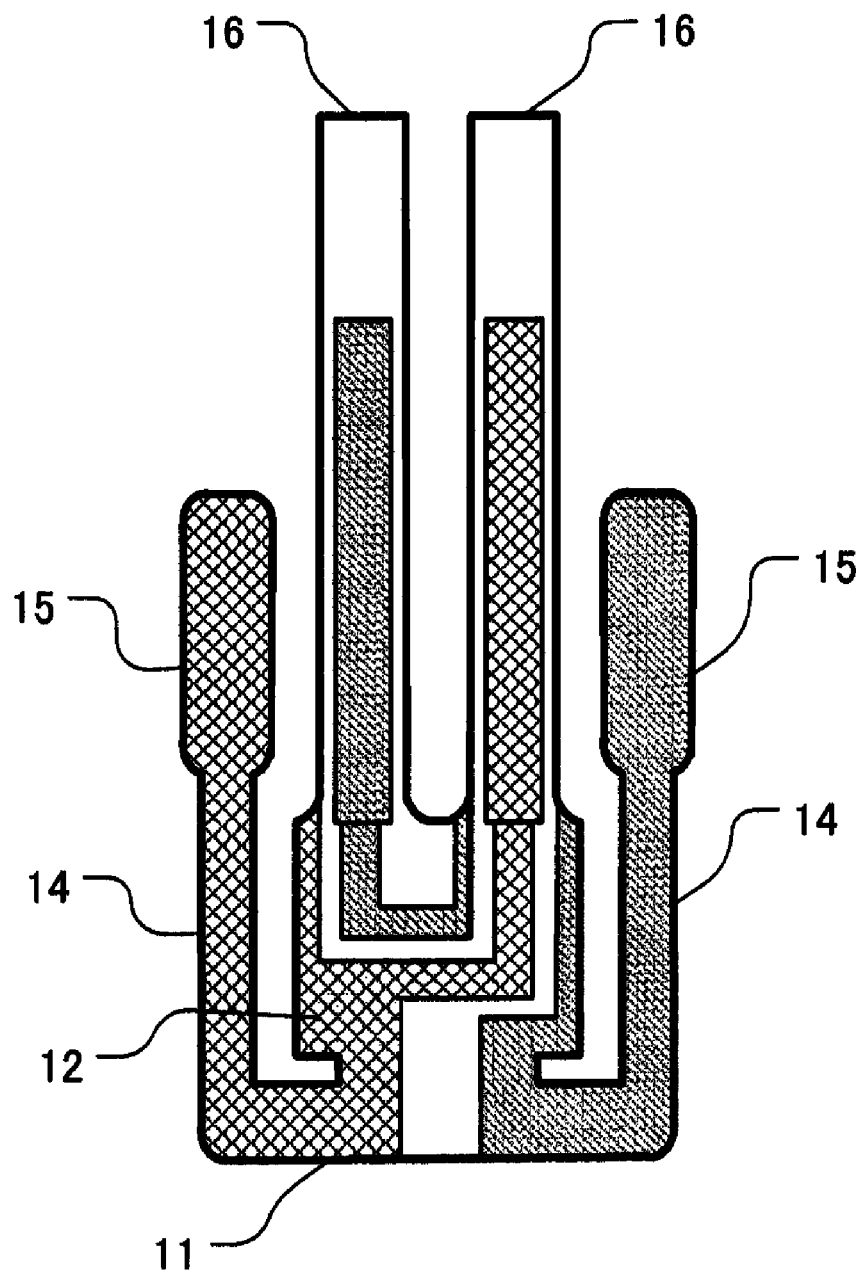
FIG. 8 is a plan view of a conventional tuning-fork type piezoelectric vibrating piece having supporting arms.

This embodiment is shown in FIG. 6, which is a plan view of the tuning-fork type crystal vibrating piece 130 comprising a pair of vibrating arms 22c. Except for the following description of the vibrating arms 22c, descriptions of other components and features of the crystal vibrating piece 130 are not provided because the other components and features are as described above in the first embodiment. Also, the electrodes are not described or shown to facilitate clarity of features actually shown.

Each vibrating arm 41 of the fourth embodiment extends upward (Y-direction) from the base 23 parallel to each other. From the root portions 26, 27, the width of each vibrating arm 41 progressively decreases with increasing distance (Y-direction) from the base 23, up to the first constriction (first "width") 46. With increasing distance (Y-direction) from the first constriction 46, the width of each vibrating arm 41 progressively decreases further, up to the second constriction (second "width") 47. From the second constriction 47, the vibrating arms 41 have respective hammer-heads 36.

The supporting arms 22c of this embodiment are similar to the supporting arms 22a, 22b described above. Each supporting arm 22c gradually narrows from its third constriction (third "width") 48 and narrows further from the third constriction to the fourth constriction (fourth "width") 49 near the distal tip of the arm. Each supporting arm 22c also progressively narrows with increasing distance (Y-direction) from the corner location 44 of the base 23, up to a fifth constriction (fifth "width") 45. Each supporting arm 22c becomes suddenly wider at the fourth and fifth constrictions 49, 45 to provide each arm with a hammer-head 37. Thus, the supporting arms 22c that progressively narrow from the third constriction 48 and from the corner location 44 of the base 23 effectively absorb oscillation leakages.

In the same way as the first embodiment, the fourth embodiment 130 of a tuning fork type crystal vibrating piece can be sealed in a package PKG to form a piezoelectric device 50. Also, adjustment of vibration frequency can be performed after sealing, as discussed above.

Alternative configurations of the tuning-fork type crystal vibrating pieces of the first, second, third, and fourth embodiments are shown in FIGS. 7A-7D, respectively. In the first, second, third, and forth embodiments, the outline profiles (in the X-Y plane) of the root portions 26 of the vibrating arms and the root portions 27 of supporting arms are linearly (angularly) U-shaped. Alternatively, as shown in FIGS. 7A-7D, these outline provides can be smooth (rounded or curved) U-shaped. Further, in the first, second, third, and forth embodiments, the tuning-fork type crystal vibrating piece is affixed in the package by two mounting regions 25, with one mounting region per supporting arm. Alternatively, each supporting arm can have multiple (e.g., two) mounting regions 25, 28, as shown in FIGS. 7A-7D. Use of a second mounting region 28 in addition to the first mounting region 25 increases the rigidity of each supporting arms. Multiple mounting regions per arm prevent ready conduction of vibration oscillations to the package PKG and reduce the adverse influences of changes in external temperature and/or of physical impacts from dropping the package PKG.

The invention has been described above in the context of preferred embodiments. It will be understood by those of ordinary skill in the art that the invention can be varied and/or modified within the scope of this invention. For example, the piezoelectric vibrating pieces described herein were made of quartz crystal. However, any of various piezoelectric single-crystal materials alternatively can be used, such as lithium niobate.

What is claimed is:

1. A piezoelectric vibrating piece, comprising:
   a base having a first end edge, an opposing second end edge, and side edges extending from the first end edge to the second end edge;
   a pair of vibrating arms extending from the first end edge of the base in a designated longitudinal direction;
   a respective supporting arm extending from each side edge of the base, outboard of the vibrating arms, in the designated longitudinal direction, each supporting arm having a distal end and at least one mounting region near the distal end;
   a vibrating-root portion situated between the vibrating arms at the first end edge of the base; and respective supporting-root portions situated at the first end edge of the base between each vibrating arm and respective supporting arm;

wherein each supporting arm has a longitudinal edge extending from the respective supporting root portion to the mounting region, each supporting arm progressively narrowing in the designated longitudinal direction from the proximal portion to the respective distal-end region;

each vibrating arm has a longitudinal edge extending, opposite the longitudinal edge of the respective supporting arm; and the longitudinal edges extend in a symmetrical manner relative to a respective centerline extending in the designated longitudinal direction between the respective vibrating arm and supporting arm.

2. The piezoelectric vibrating piece of claim 1, wherein a distance in the designated longitudinal direction from the second end edge of the base to the vibrating root portion is equal to a distance in the designated longitudinal direction from the second end edge to each of the supporting root portion.

3. The piezoelectric vibrating piece of claim 2, wherein the supporting-root portions and the vibrating-root portion have substantially similar plan profiles.

4. The piezoelectric vibrating piece of claim 1, wherein:
each vibrating arm progressively narrows in the designated longitudinal direction from the root portion to a constriction; and
each vibrating arm has a distal-end region that is wider than the constriction.

5. The piezoelectric vibrating piece of claim 1, wherein:
each vibrating arm progressively narrows in the designated longitudinal direction from the root portion to a first width and from the first width to a second width narrower than the first width: and
in the distal-end region from the second width to a distal end, each vibrating arm has a width greater than the second width.

6. The piezoelectric vibrating piece of claim 1, wherein:
each vibrating arm progressively narrows in the designated longitudinal direction from the root portion to a constriction; and
each vibrating arm progressively widens in the designated longitudinal direction from the constriction to a distal end.

7. A piezoelectric device, comprising:
a package base;
a piezoelectric vibrating piece as recited in claim 1 mounted via its supporting arms to the package base; and
a lid covering the piezoelectric vibrating piece.

8. A piezoelectric vibrating piece, comprising:
a base having a first end edge, an opposing second end edge, and side edges extending from the first end edge to the second end edge;
a pair of vibrating arms extending from the first end edge of the base in a designated longitudinal direction; and
a respective supporting arm extending from each side edge of the base, outboard of the vibrating arms, in the designated longitudinal direction, each supporting arm having a proximal portion at the respective side edge of the base, a distal-end region, and at least one mounting region in the distal-end region;
wherein each supporting arm progressively narrows in the designated longitudinal direction from the proximal portion to the respective distal-end region.

9. The piezoelectric vibrating piece of claim 8, wherein:
each supporting arm includes first and second longitudinal side edges; and
each supporting arm progressively narrows in the designated longitudinal direction by at least one of the first and second longitudinal side edges being tilted relative to the designated longitudinal direction.

10. The piezoelectric vibrating piece of claim 9, further comprising respective supporting-root portions situated between each vibrating arm and its respective supporting arm at the first end edge of the base, wherein a longitudinal side edge of each supporting arm and an opposing longitudinal side edge of the respective vibrating arm are symmetrical relative to a respective centerline extending in the designated direction through the respective supporting-root portion.

11. The piezoelectric vibrating piece of claim 10, further comprising a vibrating-root portion situated between the vibrating arms at the first end edge, wherein a distance in the designated longitudinal direction from the second end edge of the base to the respective supporting-root portion is substantially equal to a distance in the designated longitudinal direction from the second end edge to the vibrating root portion.

12. The piezoelectric vibrating piece of claim 11, wherein the supporting-root portions and the vibrating-root portions have similar respective plan profiles.

13. The piezoelectric vibrating piece of claim 8, further comprising a supporting-root portion situated between each supporting arm and its respective vibrating arm at the first end edge,
wherein each supporting arm has a respective longitudinal side edge and each vibrating arm has a respective longitudinal side edge; and
the longitudinal side edge of each supporting arm and opposing longitudinal side edge of each respective vibrating arm are symmetrical relative to a respective centerline extending in the designated longitudinal direction between each vibrating arm and its respective supporting arm.

14. The piezoelectric vibrating piece of claim 13, further comprising a vibrating-root portion situated at the first end edge of the base between the vibrating arms, wherein a distance in the designated longitudinal direction from the second end edge of the base to a respective supporting-root portion is substantially equal to a distance in the designated longitudinal direction from the second end edge to the vibrating root portion.

15. The piezoelectric vibrating piece of claim 14, wherein the supporting-root portions and vibrating-root portion have substantially similar plan profiles.

16. The piezoelectric vibrating piece of claim 8, wherein:
each vibrating arm progressively narrows in the designated longitudinal direction from the root portion to a constriction; and
each vibrating arm has a distal-end region that is wider than the constriction.

17. The piezoelectric vibrating piece of claim 8, wherein:
each vibrating arm progressively narrows in the designated longitudinal direction from the root portion to a first width and from the first width to a second width narrower than the first width: and
in the distal-end region from the second width to a distal end, each vibrating arm has a width greater than the second width.

18. The piezoelectric vibrating piece of claim 8, wherein:
each vibrating arm progressively narrows in the designated longitudinal direction from the root portion to a constriction; and each vibrating arm progressively widens in the designated longitudinal direction from the constriction to a distal end.

19. The piezoelectric vibrating piece of claim 8, wherein:
   each vibrating arm has a first width, a second width, and a distal end;
   each vibrating arm progressively narrows in the designated longitudinal direction from the root portion to the first width and from the first width to the second width: and from the second width to the distal end, each vibrating arm has a width greater than the second width.

20. A piezoelectric device, comprising:
   a package base;
   a piezoelectric vibrating piece as recited in claim 8 mounted via its supporting arms to the package base; and
   a lid covering the piezoelectric vibrating piece.

* * * * *